United States Patent
Shih

(10) Patent No.: US 7,119,725 B1
(45) Date of Patent: *Oct. 10, 2006

(54) SIGMA-DELTA MODULATOR, D/A CONVERSION SYSTEM AND DYNAMIC ELEMENT MATCHING METHOD

(75) Inventor: Ke-Yan Shih, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/192,957

(22) Filed: Jul. 29, 2005

(51) Int. Cl.
*H03M 3/00* (2006.01)
(52) U.S. Cl. ................ 341/143; 341/144
(58) Field of Classification Search ........ 341/155, 341/144, 143
See application file for complete search history.

(56) References Cited

U.S. PATENT DOCUMENTS

| | | | |
|---|---|---|---|
| 6,515,607 B1 * | 2/2003 | Liu et al. | 341/143 |
| 6,677,875 B1 * | 1/2004 | Dagher et al. | 341/143 |
| 6,864,819 B1 * | 3/2005 | Wang | 341/143 |
| 6,956,514 B1 * | 10/2005 | Melanson et al. | 341/143 |

* cited by examiner

*Primary Examiner*—Peguy JeanPierre
(74) *Attorney, Agent, or Firm*—Winston Hsu

(57) ABSTRACT

A sigma-delta modulator comprises a summer, a loop filter, a quantizer, a D/A converter and a dynamic element matching logic. The summer receives an analog input signal and a feedback signal to generate an error signal to the loop filter which generates a filtered signal to the quantizer, thereby converting the filtered signal to a quantized output signal to the D/A converter including first and second converting elements which together form a plurality of D/A elements and generating the feedback signal. The dynamic element matching logic selects the D/A elements and determines the number of groups into which the D/A elements are divided, where the number of the groups is prime to that of the first converting elements, distributes the D/A elements to each group equally, and selects the groups and D/A elements thereof according to the quantized output signal and the previous selection of groups and D/A elements.

21 Claims, 8 Drawing Sheets

SIGMA-DELTA MODULATOR, D/A CONVERSION SYSTEM AND DYNAMIC ELEMENT MATCHING METHOD

BACKGROUND

The invention relates to a data conversion system, and more particularly to a sigma-delta modulator, data conversion system and method with dynamic element matching logic.

Data conversion techniques have been in existence for many years, and their use has become widespread. Converters used, such as a digital-to-analog (D/A) converter or an analog-to-digital (A/D) converter, have found homes in applications such as communication systems, consumer and professional audio, and precision measurement devices.

Sigma-delta modulator (SDM), an A/D converter also known as an oversampling A/D converters characterized by high dynamic range and high resolution, has been successfully applied in communication and other signal processing areas. One-bit sigma-delta modulators have been popular in the past for their inherent linearity. However, to fulfill the demand for higher resolution and wider bandwidth without increasing the oversampling ratio, it is necessary to utilize multi-bit sigma-delta modulators which also reduce quantization noise power. Nevertheless, the major drawback of the multi-bit sigma-delta modulators is non-linearity stemming from the mismatching between the D/A elements in the feedback multi-bit D/A converter of the SDMs. The mismatching between the D/A elements in the multi-bit D/A converter, such as capacitors, resistors, current sources and the like, due to manufacturing variations, imperfections in materials used, changes in temperature, humidity, degradation and so on, causes non-linearity in the feedback path, which manifests itself as distortion and noise at output.

One approach addressing non-linearity in multi-bit D/A converters is dynamic element matching (DEM). Dynamic element matching (DEM) randomly selects D/A elements in the multi-bit D/A converter to distribute the non-linear error across the spectrum. Moreover, a particular DEM technique is the data weighted average (DWA). The conventional DWA logic regularly selects the D/A elements of multi-bit converter one by one at a predetermined turn according to a digital input code of the converter. DWA technique averages the participation of each D/A element, thus shifting DAC (D/A converter) mismatch errors to a higher frequency band and providing easy implementation and first order noise shaping.

However, since the DWA logic depends on the amplitude of the input digital code, in-band tones occur when the input amplitude is small, reducing both the SNDR (signal-to-noise plus distortion ratio) and SFDR (spur free dynamic range) significantly. FIG. 1 shows a N-bit sigma-delta modulator 10, wherein N is an integer greater than 2, effectively removing in-band tones, and thus increasing the in-band efficiency of sigma-delta modulators. The N-bit sigma-delta modulator 10 is disclosed in commonly assigned U.S. patent application Ser. No. 11/152,132 filed Jun. 14, 2005, entitled "Sigma-delta modulator, D/A conversion system and dynamic element matching method", incorporated herein by reference. The sigma-delta modulator 10 comprises a summing junction 12, a loop filter 14, an N-bit quantizer 16, an N-bit D/A converter 18 and a dynamic element matching logic 22. The summing junction 12 receives an analog input signal $V_{in}$ and subtracts an analog feedback signal $V_{FB}$ from the N-bit D/A converter 18. The loop filter 14 coupled to the summing junction 12, receiving the output of the summing junction 12, includes cascaded analog integrator stages and generates a filtered analog output to the N-bit quantizer 16. The N-bit quantizer 16 then quantizes the analog output of the loop filter 14 and generates a digital code, also fed back to the N-bit D/A converter 18. The N-bit D/A converter 18, having a plurality of D/A elements, convertes the digital code to the analog feedback signal $V_{FB}$ to the summing junction 12. The dynamic element matching logic 22 coupled between the N-bit quantizer 16 and N-bit D/A converter 18. The operation of the dynamic element matching logic 22 is described in the following.

It is assumed that the N-bit D/A converter 18 includes 8 D/A elements, C1~C8. The dynamic element matching logic 22 divides the D/A elements into groups, wherein the number of the groups is prime to the number of the D/A elements. For example, if there are 8 D/A elements in the D/A converter 18, the dynamic element matching logic 22 divides C1~C8 into 3, 5, or 7 groups. FIG. 2 shows an exemplary dynamic element matching logic 22 with the D/A converter 18 including 8 D/A elements, wherein the dynamic element matching logic 22 divides the D/A elements into 3 groups. In FIG. 2, the y-axis denotes the digital code input at every time slot and the grey blocks on the x-axis and the numerals therein denote corresponding selected elements and selected orders. The dynamic element matching logic 2.2 divides C1~C8 into 3 groups wherein C1~C3 is the first group, C4~C5 is the second, and C6~C8 is the third. When receiving digital code from the N-bit quantizer 16, the dynamic element matching logic 22 selects groups and the D/A elements therein according to the digital code, and the previous selection of group and D/A element, and the number of selected dynamic elements corresponds to the digital code. For example, when the input code is 5 at time t1, the dynamic element matching logic 22 selects C1 from the first group, C4 from the second group, C6 from the third group, C2 from the first group, and C5 from the second group accordingly in the turn of the arrow. When the input code is 2 at time t2, starting from the D/A element succeeding the previous last selected D/A element of the group succeeding the previous last selected group (i.e. C7 in the third group), the dynamic element matching logic 22 proceeds to select C7 from the third group and C3 from the first group accordingly.

Although the described dynamic element matching logic removes in-band tones, it may, however, select the same D/A element repeatedly with large input signal amplitude. FIG. 3 shows another example of the dynamic element matching logic 22 of FIG. 2. As shown in FIG. 3, the dynamic element matching logic 32 also divides C1~C8 into 3 groups wherein C1~C3 is the first group, C4~C5 is the second, and C6~C8 is the third. When the input code is 4 at time t2, the dynamic element matching logic 32 selects C2, C5, C7 and C3 in turn. When the input code is 7 at time t3, the dynamic element matching logic 22 proceeds to select C4, C8, C1, C5, C6, C2 and C5 in turn. It is observed that the dynamic element matching logic 22 selects the D/A element C5 twice. Typically, the frequency of the operating clock is increased to solve this problem, this, however, complicates the circuits and increases the costs. Consequently, a simple method for solving described problem without extra effort that maintains the performance of the described dynamic element matching logic is desired.

SUMMARY

Sigma-delta modulators are provided. An exemplary embodiment of a sigma-delta modulator comprises a summer, a loop filter, a quantizer, a D/A (digital-to-analog) converter, and a dynamic element matching logic. The summer receives an analog input signal and a feedback signal generating an error signal corresponding to the difference between the analog input signal and the feedback signal. The loop filter is coupled to the summer and receives the error signal therefrom to generate a filtered signal. The quantizer is coupled to the loop filter and converts the filtered signal to a quantized output signal. The D/A (digital-to-analog) converter, coupled to the summer, comprises a plurality of first converting elements and at least one second converting element, wherein the first and second converting elements form a plurality of D/A elements. The D/A converter generates the feedback signal corresponding to the quantized output signal to the summer. The dynamic element matching logic, coupled between the quantizer and the D/A converter, receives the quantized output signal and selects the D/A elements of the D/A converter. The dynamic element matching logic determines the number of groups into which the D/A elements are divided, where the number of the groups is prime to that of the first converting elements, distributes the D/A elements to each group equally, and selects the groups and D/A elements thereof according to the quantized output signal and the previous selection of groups and D/A elements.

An exemplary embodiment of a D/A (digital-to-analog) conversion system comprises a D/A (digital-to-analog) converter and a dynamic element matching logic. The D/A (digital-to-analog) converter comprises a plurality of first converting elements and at least one second converting element, wherein the first and second converting elements form a plurality of D/A elements. The D/A converter generates an analog output signal corresponding to a digital input signal. The dynamic element matching logic, coupled to the D/A converter, receives the digital input signal and selects the D/A elements of the D/A converter. The dynamic element matching logic determines the number of groups into which the D/A elements are divided, where the number of the groups is prime to that of the first converting elements, distributes the D/A elements to each group equally, and selects the groups and D/A elements thereof according to the quantized output signal and the previous selection of groups and D/A elements.

An exemplary embodiment of a method for selecting D/A elements according to a digital input code in a conversion system. The conversion system comprises a plurality of first converting elements and at least one second converting element, wherein the first and second converting elements form a plurality of D/A elements. The method comprises determining the number of groups into which the D/A elements are divided, where the number of the groups is prime to that of the first converting elements, distributing the D/A elements to each group equally, and selecting the groups and D/A elements according to the digital input code and the previous selection of groups and D/A elements.

DESCRIPTION OF THE DRAWINGS

The invention is described by way of exemplary embodiments, but not limitations, illustrated in the accompanying drawings in which like references denote similar elements, and in which.

DETAILED DESCRIPTION

Figure 1:
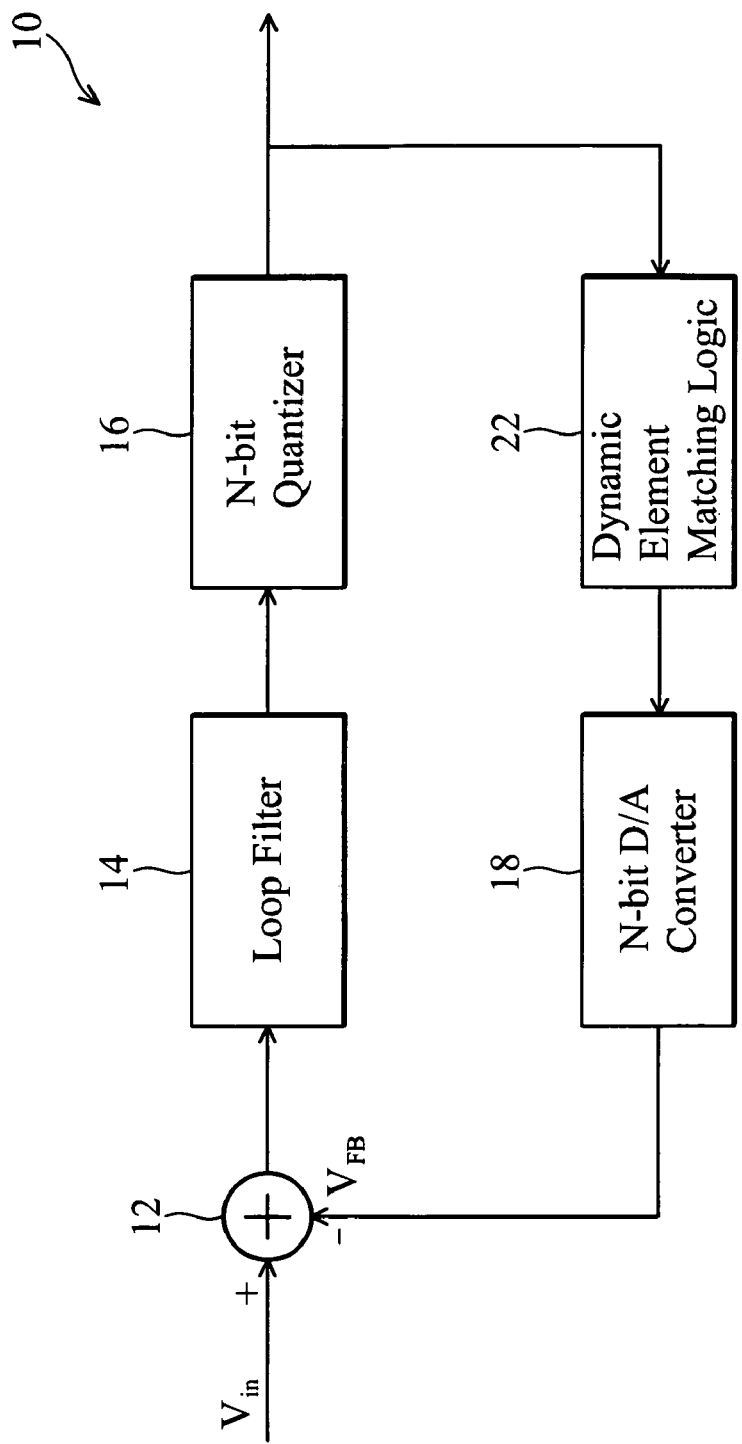
FIG. 1 is a block diagram of a conventional N-bit sigma-delta modulator.
Figure 2:
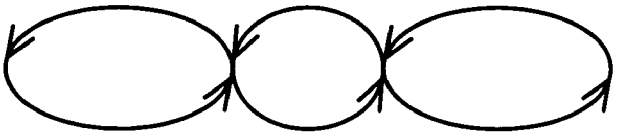
FIG. 2 is a schematic diagram of the dynamic element matching logic of FIG. 1 with a 3-bit D/A converter having 8 D/A elements.
Figure 3:
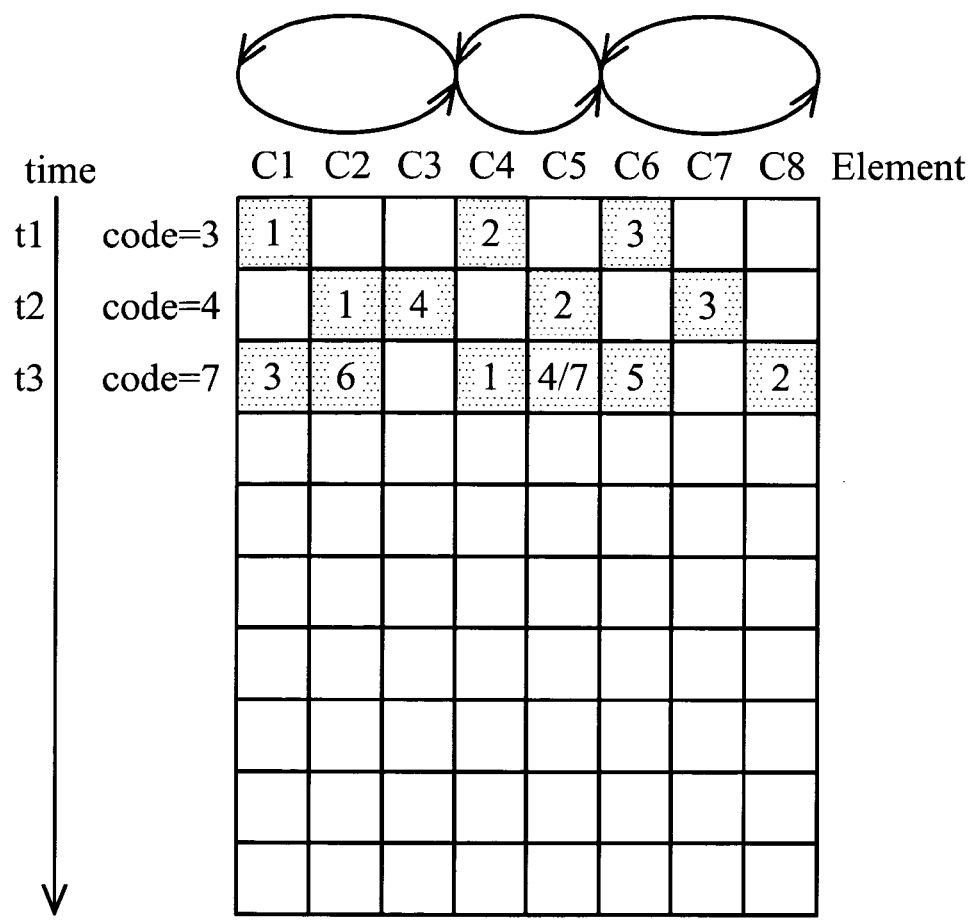
FIG. 3 shows another schematic diagram of the dynamic element matching logic of FIG. 1 with a 3-bit D/A converter having 8 D/A elements.
Figure 4:
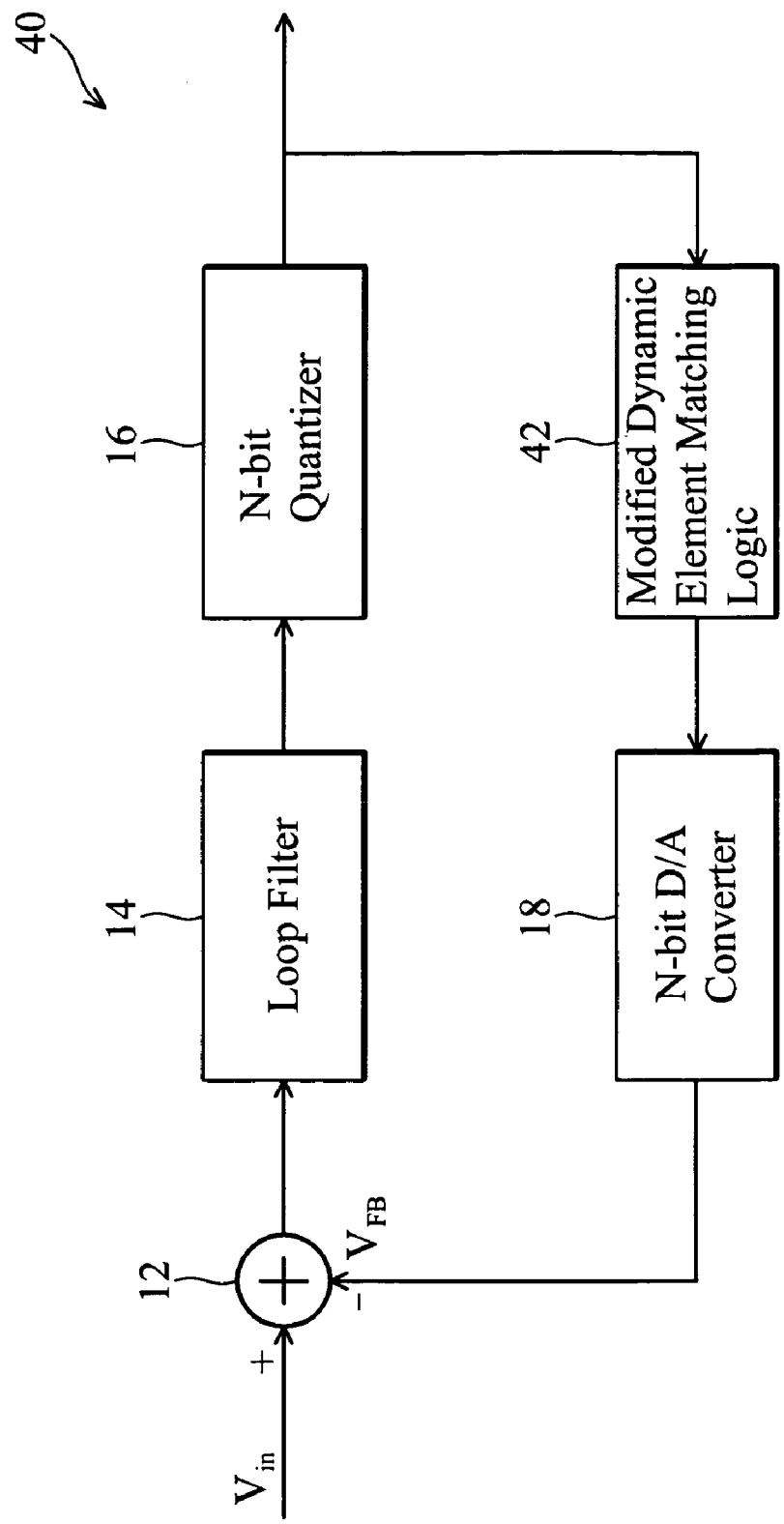
FIG. 4 is a block diagram of an embodiment of an N-bit sigma-delta modulator.

FIG. 4 shows an embodiment of an N-bit sigma-delta modulator 40. The sigma-delta modulator 40 comprises a summing junction 12, a loop filter 14, an N-bit quantizer 16, an N-bit D/A converter 18 and a modified dynamic element matching logic 42. FIG. 4 is similar to FIG. 1 with the exception of the modified dynamic element matching logic 42. The units in FIG. 4, using the same reference numerals as those in FIG. 1, perform the same functions, and thus are not described in further detail. The operation of the modified dynamic element matching logic 42 is described as follows.

Figure 5:
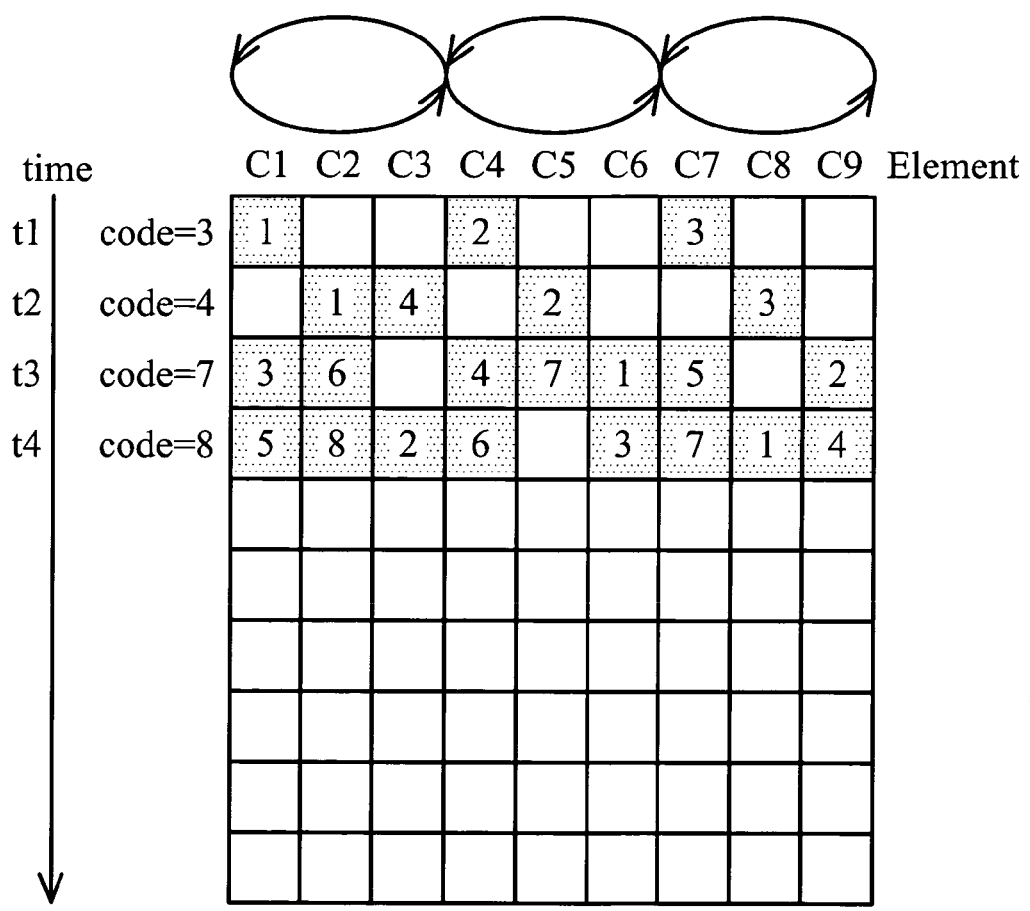
FIG. 5 shows an example of the dynamic element matching logic of the invention with a 3-bit D/A converter having 8 first converting elements and 1 second converting element.

Assuming the N-bit D/A converter 18 is a 3-bit D/A converter including 8 first converting elements, C1~C8, and at least one second converting element, wherein the first and second converting elements form a plurality of D/A elements, the modified dynamic element matching logic 42 determines how many groups the D/A elements are divided into, wherein the number of the groups is prime to the number of the first converting elements. Assuming the number of the groups is k, the number of second converting elements is obtained by $k*[div(2^N/k)+1]-2^N$. For example, assuming there are 8 first converting elements in the D/A converter 18, the modified dynamic element matching logic 42 divides the D/A elements into 3, 5, or 7 groups. Taking 3 groups as an example, there is one ($3*[div(2^3/3)+1]-2^3=1$) second converting element C9. FIG. 5 shows an exemplary embodiment of a modified dynamic element matching logic 42 with the D/A converter 18 including 8 first converting elements and one second converting element, wherein the modified dynamic element matching logic 42 divides the D/A elements into 3 groups. In FIG. 5, the y-axis denotes the digital code input at every time slot and the grey blocks on the x-axis and the numerals therein denote corresponding selected elements and selected orders. The modified dynamic element matching logic 42 divides C1~C9 into 3 groups and then distributes all the D/A elements C1~C9 to each group equally, wherein C1~C3 is the first group, C4~C6 is the second, and C7~C9 is the third. When receiving the digital code from the N-bit quantizer 16, the modified dynamic element matching logic 42 selects groups and the D/A elements therein according to the digital code, and the previous selection of group and D/A element, and the number of selected dynamic elements corresponds to the digital code as the described dynamic element matching logic 22 of FIG. 1. For example, when the input code is 3 at time t1, the modified dynamic element matching logic 42 selects C1 from the first group, C4 from the second group, and C7 from the third group accordingly in the turn of the arrow. When the input code is 4 at time t2, starting from the D/A element succeeding the previous last selected D/A element of the group succeeding the previous last selected group (i.e. C2 in the first group). The modified dynamic element matching logic 42 proceeds to select C2 from the first group, C5 from the second group, C8 from the third group, and C4 from the first group accordingly. When the input code is 7 at time t3, the modified dynamic element matching logic 42 proceeds to select C6, C9, C1, C4, C7, C2, and C5 accordingly. When the input code is 8 at time t4, the novel dynamic element matching logic 42 selects C8, C3, C6, C9, C1, C4, C7 and C2 accordingly.

Figure 6:
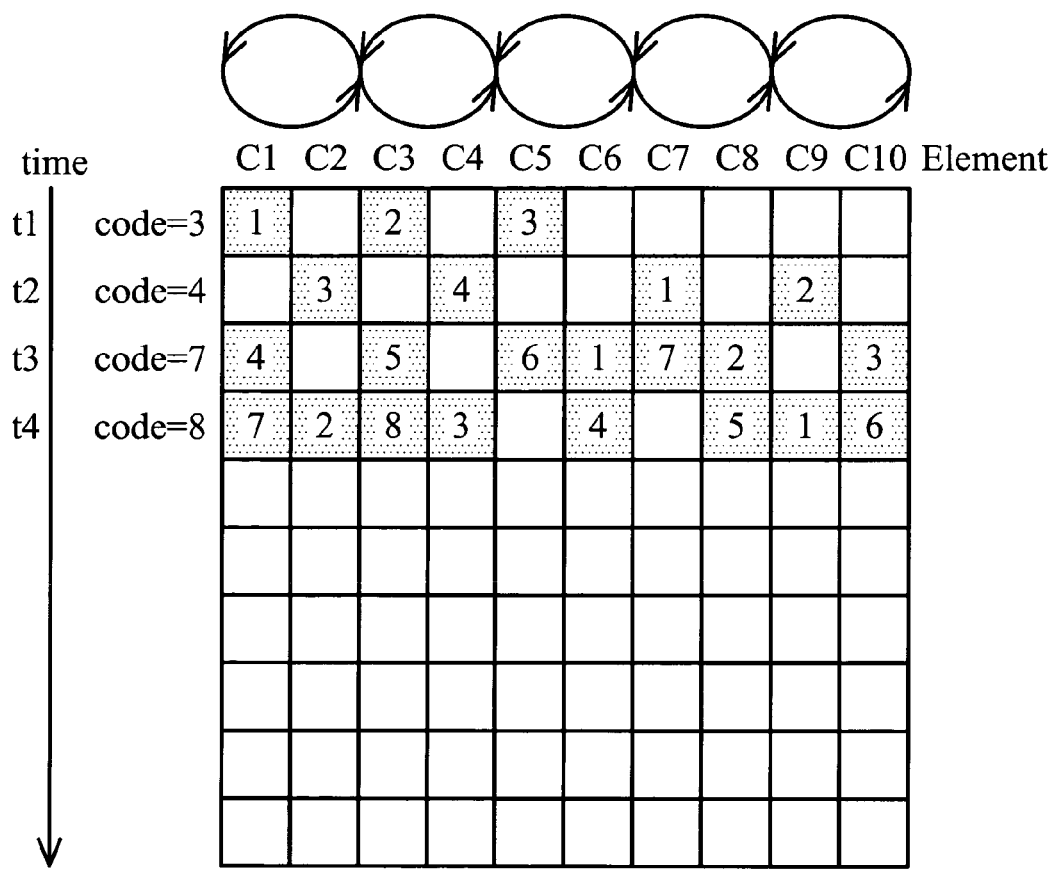
FIG. 6 shows another example of the dynamic element matching logic of the invention with a 3-bit D/A converter having 8 first converting elements and 2 second converting element.

FIG. 6 shows another exemplary embodiment of a modified dynamic element matching logic 42 with the D/A converter 18 including 8 first converting elements and at least one second converting element, wherein the modified dynamic element matching logic 42 divides the D/A elements into 5 groups. From the stated equation, the number of second converting elements is obtained by $5*(\text{div}(2^3/5)+1)-2^3=2$, thus there are two second converting elements C9, and C10 in FIG. 9. Moreover, the first converting elements C1~C8 and second converting elements C9~C10 form a plurality of D/A elements. The modified dynamic element matching logic 42 selects the D/A elements C1~C10 in accordance with the described principle. For example, when the input code is 8 at time t4, starting from the D/A element succeeding the previous last selected D/A element of the group succeeding the previous last selected group (i.e. C9 in the fifth group), the modified dynamic element matching logic 42 proceeds to select C9, C2, C4, C6, C8, C10, C1 and C3 accordingly.

Figure 7:
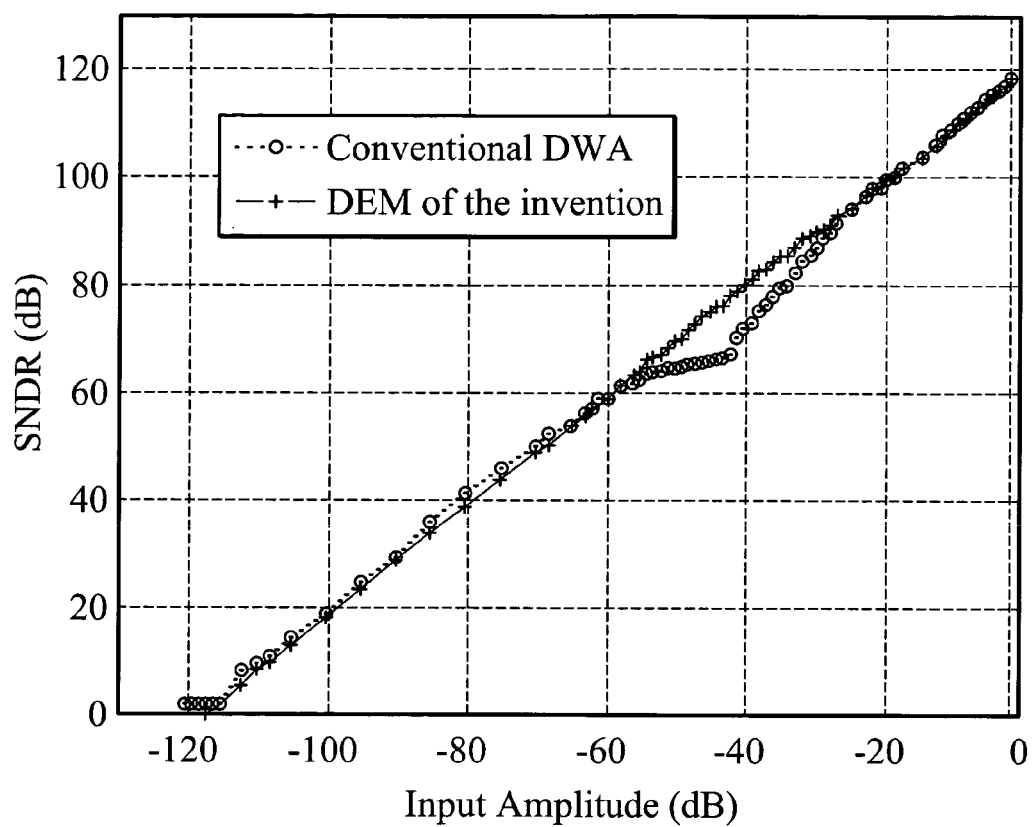
FIG. 7 is schematic diagram of input amplitude versus SNDR of sigma-delta modulators utilizing the conventional DWA technique (circle) and the dynamic element matching logic of the invention (cross).

It is obvious that none of the D/A elements in the embodiment of the modified element matching logic 42 is selected repeatedly, thus avoiding the necessity to increase the operating frequency and reducing costs. FIG. 7 shows the input amplitude versus the SNDR of sigma-delta modulators utilizing the conventional DWA technique (circle) and the dynamic element matching logic of the invention (cross). It can be found that linearity of the sigma-delta modulator utilizing the modified dynamic element matching logic of the invention improves on that of the sigma-delta modulator utilizing conventional DWA technique whereas the efficiency of the sigma-delta modulator of the invention is maintained even with a large input signal.

Figure 8:
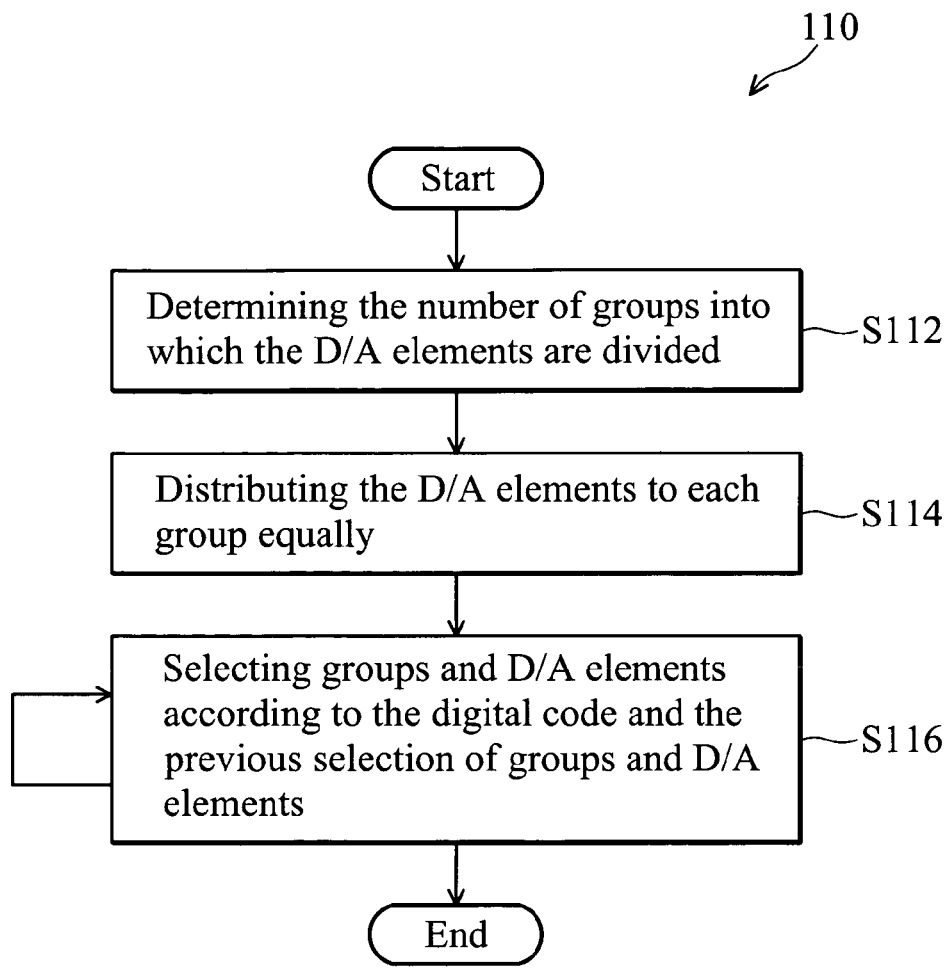
FIG. 8 is a flowchart of an embodiment of a method for selecting D/A elements in response to a digital code in a conversion system.

FIG. 8 is a flowchart of a method 110 for selecting D/A elements in response to a digital code in a conversion system. The conversion system comprises a plurality of first converting elements and at least one second converting element, wherein the first and second converting elements form a plurality of D/A elements. The number of groups into which all the D/A elements are divided is determined, wherein the number of the groups is prime to the number of first converting elements (step 112). All the D/A elements are then distributed to each group equally (step 114). The groups and D/A elements are selected according to the digital code and the previous selection of groups and D/A elements (step 116), wherein element selection is performed at a predetermined turn. Step 116 is repeated when receiving a digital code. Moreover, in step 116, the D/A element succeeding the previous selected D/A element in the group succeeding the previous last selected group is selected first and the D/A element succeeding the previous selected D/A element in the subsequent group is selected until the number of selected D/A elements corresponds to the digital code. Further, assuming the number of the groups is k and the conversion system is a N-bit D/A converter, the number of the second converting elements can be obtained by $k*[\text{div}(2^N/k)+1]-2^N$.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A sigma-delta modulator, comprising:
   a summer receiving an analog input signal and a feedback signal generating an error signal corresponding to a difference between the analog input signal and the feedback signal;
   a loop filter coupled to the summer, receiving the error signal to generate a filtered signal;
   a quantizer coupled to the loop filter, converting the filtered signal to a quantized output signal;
   a D/A (digital-to-analog) converter coupled to the summer, comprising a plurality of first converting elements and at least one second converting element, generating the feedback signal corresponding to the quantized output signal to the summer, wherein the first and second converting elements form a plurality of D/A elements; and
   a dynamic element matching logic coupled between the quantizer and the D/A converter, receiving the quantized output signal and selecting the D/A elements of the D/A converter,
   wherein the dynamic element matching logic determines the number of groups into which the D/A elements are divided, where the number of the groups is prime to that of the first converting elements, distributes the D/A elements to each group equally, and selects the groups and D/A elements thereof according to the quantized output signal and a previous selection of groups and D/A elements.

2. The sigma-delta modulator of claim 1, wherein the dynamic element matching logic selects the groups and D/A elements at a predetermined turn.

3. The sigma-delta modulator of claim 2, wherein the dynamic element matching logic first selects the D/A element succeeding a previous last selected D/A element in the group which succeeds the previous last selected group, and proceeds to select the D/A element succeeding the previous last selected D/A element in a subsequent group.

4. The sigma-delta modulator of claim 3, wherein the number of selected D/A elements corresponds to the quantized output signal.

5. The sigma-delta modulator of claim 1, wherein the D/A converter is a N-bit D/A converter.

6. The sigma-delta modulator of claim 5, wherein when the number of the groups is k, the number of the second converting elements is obtained by $k*[\text{div}(2^N/k)+1]-2^N$.

7. The sigma-delta modulator of claim 1, wherein the quantizer is a multi-bit quantizer.

8. The sigma-delta modulator of claim 1, wherein the D/A elements are capacitors, resistors or current sources.

9. A D/A (digital-to-analog) conversion system comprising:
   a D/A (digital-to-analog) converter comprising a plurality of first converting elements and at least one second converting element, generating an analog output signal corresponding to a digital input signal, wherein the first and second converting elements form a plurality of D/A elements; and a dynamic element matching logic coupled to the D/A converter, receiving the digital input signal, and selecting the D/A elements of the D/A converter, wherein the dynamic element matching logic determines the number of groups into which the D/A elements are divided, where the number of the groups is prime to that of the first converting elements, distributes the D/A elements to each group equally, and selects the groups and D/A elements thereof according to the digital input signal and a previous selection of groups and D/A elements.

10. The D/A conversion system of claim 9, wherein the dynamic element matching logic selects the groups and the D/A elements at a predetermined turn.

11. The D/A conversion system of claim 10, wherein the dynamic element matching logic first selects the D/A element succeeding a previous last selected D/A element in the group which succeeds the previous last selected group, and then proceeds to select the D/A element succeeding the previous last selected D/A element in a subsequent group.

12. The D/A conversion system of claim 11, wherein the number of selected D/A elements corresponds to the digital input signal.

13. The D/A conversion system of claim 12, wherein when the number of the groups is k, the number of the second converting elements is obtained by $k*[div(2^N/k)+1]-2^N$.

14. The D/A conversion system of claim 9, wherein the D/A converter is an N-bit D/A converter.

15. The D/A conversion system of claim 9, wherein the D/A elements are capacitors, resistors or current sources.

16. A method for selecting D/A elements according to a digital input code in a conversion system comprising a plurality of first converting elements and at least one second converting element, wherein the first and second converting elements form a plurality of D/A elements, the method comprising:

determining the number of groups into which the D/A elements are divided, where the number of the groups is prime to that of the first converting elements;

distributing the D/A elements to each group equally; and selecting the groups and D/A elements according to the digital input code and a previous selection of groups and D/A elements.

17. The method of claim 16, wherein the D/A elements are selected at a predetermined turn.

18. The method of claim 17, wherein the D/A element succeeding a previous last selected D/A element in the group which succeeds the previous last selected group is first selected, and then the D/A element succeeding the previous last selected D/A element in a subsequent group.

19. The method of claim 18, wherein the number of selected D/A elements corresponds to the digital input code.

20. The method of claim 16, wherein the conversion system is an N-bit D/A converter.

21. The method of claim 20, wherein when the number of the groups is k, the number of the second converting elements is obtained by $k*[div(2^N/k)+1]-2^N$.

* * * * *